United States Patent [19]

Day

[11] Patent Number: 4,888,861

[45] Date of Patent: Dec. 26, 1989

[54] ANNULAR ARRAY AND METHOD OF MANUFACTURING SAME

[75] Inventor: Robert A. Day, Livermore, Calif.

[73] Assignee: The United States of America as represented by the United States Department of Energy, Washington, D.C.

[21] Appl. No.: 786,384

[22] Filed: Oct. 10, 1985

[51] Int. Cl.[4] ....................... H01L 41/22; H01L 41/04

[52] U.S. Cl. .................................... 29/25.35; 310/322; 310/335; 310/369

[58] Field of Search ....................... 29/25.35, 416, 418; 310/322, 334, 335, 337, 369

[56] References Cited

U.S. PATENT DOCUMENTS

| | | | |
|---|---|---|---|
| 2,956,184 | 10/1960 | Pollack | 310/369 X |
| 3,624,896 | 12/1971 | Danbeney et al. | 29/416 X |
| 4,166,230 | 8/1979 | Luft | 310/369 X |

*Primary Examiner*—Carl E. Hall

*Attorney, Agent, or Firm*—L. E. Carnahan; Roger S. Gaither; William R. Moser

[57] ABSTRACT

A method for manufacturing an annular acoustic transducer array from a plate of transducer material, which enables production of precision aligned arrays at low cost. The circular plate is sawed along at least two lines that are radial to the axis of the plate. At steps along each radial cut, the plate is rotated first in one direction and then in an opposite direction by a predetermined angle such as slightly less than 90°. The cuts result in the forming of several largely ring-shaped lands, each largely ring-shaped land being joined to the other rings of different radii by thin portions of the plate, and each ring being cut into segments. The bridges that join different rings, hold the transducer together until it can be mounted on a lens.

10 Claims, 2 Drawing Sheets

ANNULAR ARRAY AND METHOD OF MANUFACTURING SAME

The Government has rights in this invention pursuant to Contract No. DE-AT03-76SF70030 awarded by the U.S. Department of Energy.

BACKGROUND OF THE INVENTION

Annular acoustic arrays generally include a group of concentric rings of a piezoelectric or ferro-electric material which are mounted precisely concentric on a lens. The phase of operation of the different rings can be closely controlled to transmit or receive sound from a particular depth. It is often advantageous to divide the rings into segments so the direction of focus can be shifted sidewardly.

The manufacture of an annular phased array is complicated by the difficulties of cutting and machining the brittle piezoelectric materials that are used. The manufacture of such arrays is an active area of investigation. A simple method of fabrication is to apply an electrode to the back of the crystal plate in the pattern desired, to etch away the pattern to a depth just short of the opposite face of the plate. However, the ring elements are still mechanically attached at their front face, which degrades the performance of the resulting transducer. Separate rings have been machined, but it is difficult and time consuming to position the rings precisely concentric on a lens. The difficulty increases where each ring is formed in segments. A low cost method for forming piezoelectric rings, especially in segments, and mounting them precisely concentric on a lens, with each ring or segment being substantially isolated from adjoining rings and segments, would be of considerable value.

SUMMARY OF THE INVENTION

It is an object of this invention to provide an annular acoustic array which is easily formed and handled for mounting.

A further object is to provide an efficient method for forming and mounting an acoustic annular array.

In accordance with one embodiment of the present invention, an annular array and method for forming it are provided, which results in a low cost and efficient array. The array includes a plate of acoustic transducer material having a plurality of sets of annular cuts that are all concentric to an axis. All cuts of the same set have the same radius, but their ends are spaced to form thin bridges between them. The regions of the plate between sets of cuts form acoustic transducer rings which are largely isolated from one another except at the thin bridges where their coupling is minimal.

The cuts are formed by sawing the plate of acoustic material along a line radial to the axis, and then rotating the plate by no more than about 90° in one direction and then in the opposite direction from the radial cut. After each pair of such cuts is made by turning the plate, the saw is advanced along the radial line to a different radius and the plate is again turned in opposite directions from the cut.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
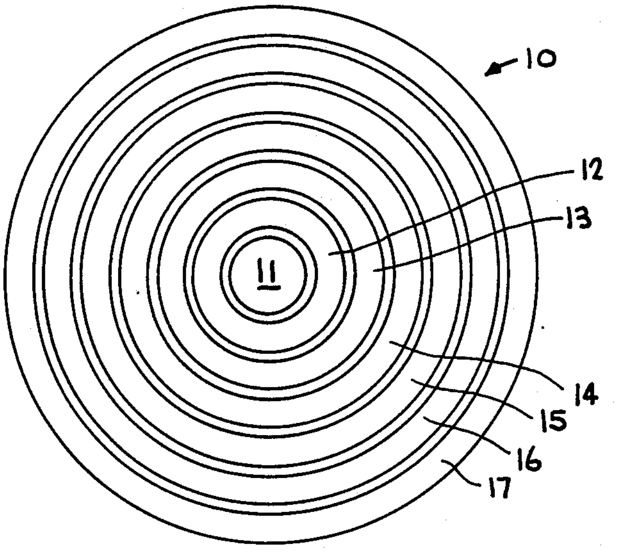
FIG. 1 (PRIOR ART)
FIG. 1 is a plan view of an annular acoustic transducer array of the prior art.
Figure 2:
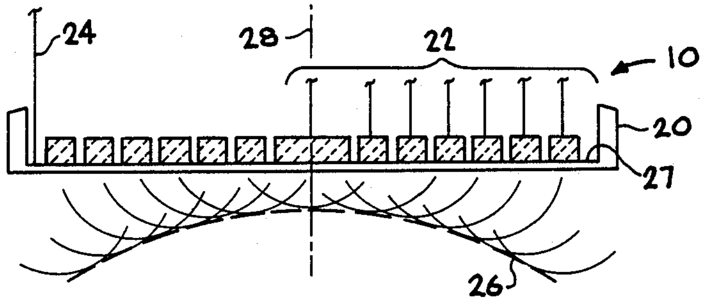
FIG. 2 is a sectional view of an acoustic transducer of both the prior art and the present invention, shown mounted on a lens and being used to transmit sound.

FIGS. 1 and 2 illustrate an annular acoustic transducer array 10 of the prior art, which included a plurality of concentric rings 11–17, of which all but the centermost one are band shaped with holes in their middle. The array is formed of piezoelectric material and is mounted on a lens 20 whose lowermost surface faces an object to be acoustically interrogated. A group of electrodes 22 are coupled to one side of each ring while a common electrode 24 is coupled to the opposite side of the rings. When variable voltages are applied across the thickness of the rings, they radiate acoustic energy, and the phases of the voltages can be controlled so that the acoustic energy has a controlled circular wave front 26 that concentrates sound at a particular location. The array can also be used to detect sound from a particular depth. If the rings are cut into segments and the segments are driven out of phase with respect to one another, the wave front 26 can be directed sidewardly.

If the rings are formed as shown in FIG. 1 and attempts are then made to bond them to a supporting surface 27 of a holder formed by the lens 20, considerable time and expense is required to position the rings accurately concentric with axis 28. Applicant avoids this problem by forming the array in a configuration shown at 30 in FIG. 3. The array 30 has nine sets of concentric annular cuts, including an outermost set 32, a radially innermost set 34, and a middle set 36. Each set of cuts such as the middle set 36 includes two cuts 36*a*, 36*b* which are both of the same radial distance 38 from the axis 40 of the array. Each cut extends by less than 360° and preferably no more than about 180°, and in fact here each cut extends by a few degrees less than 180°. As a result, the pair of cuts 36*a*, 36*b* of the set extend short of each other to form cut ends 42, 44 which are spaced apart to leave a bridge 46 between them. The opposite ends of the cuts 36*a*, 36*b* are also spaced to leave another bridge 48 between them. The different sets of cuts such as 36 and the adjacent cut 50 are of different radii with respect to the axis 40, so they leave a land 52 between them. The land 52 forms a portion of the acoustic transducer which generates and/or detects sound waves.

The array 30 with ten lands such as 52 form therein (all but the innermost land are band-shaped) can be readily mounted on a lens with all of the lands maintained precisely concentric. The bridges such as 46, 48 on opposite sides of the axis 40 lie on radial lines such as 49 and maintain the lands concentric and hold them together (provided care is used) until the array can be bonded to the lens. Where the bridges 46 have an average length which is no more than about ten percent of the length of the sets of cuts, they introduce substantially negligent coupling between adjacent lands. Thus, by forming an array similar to that of FIG. 1, but with at least two narrow lands on opposite sides of the axis connecting those lands of different radii, the array operates with high efficiency and yet can be easily handled during the process of mounting it on a lens with all of the lands precisely concentric.

Applicant manufactures the array 30 by sawing the cuts such as 36*a*, 36*b* so they each extend from opposite sides of a largely radially-extending cut 54 or 56. Applicant cuts along a largely radial line such as 58, from the outer edge 60 of the plate 62 of the transducer material of which the array is made. At every location where an annular cut such as 32 is to be formed, applicant rotates the plate 62 around the axis 40, first in one direction 64 up to a cut end, and then in the opposite direction 66 to the other end of the cut. Then the plate 62 is rotated back so the saw tool or saw is on the line 58, and the saw is then advanced along the line 58 to a radius where the next cut such as 68 is to be made ad the process is repeated. Thereafter, the saw is withdrawn, and the plate is turned 180° and the largely radial cut 56 and annular cuts such as 36*b* are made.

Figure 4:
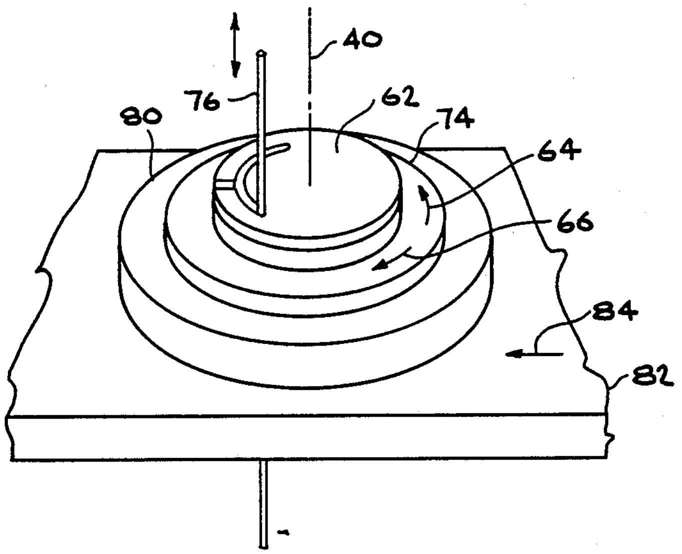
FIG. 4 is a perspective view showing the manner in which the array of FIG. 3 is manufactured.

The saw is a cutting element such as an abrasive wire which moves largely perpendicular to the surface of the plate 62. The wire can move continuously in one direction, although it is more commonly reciprocated up and down. Such saws cut rapidly and are of relatively low cost. FIG. 4 shows a setup which can be used. The workpiece or plate 62 of transducer material is attached to a turntable platform 74 which can rotate in the directions 64, 66 about the axis 40. A wire saw 76 which is coated with industrial diamonds moves up and down. The workpiece 62, which can be a disc of lithium niobate, is attached to the turntable as by a coating of wax. The turntable platform is mounted on a turning mechanism and holder 80 which is, in turn, mounted on a linearly moveable bed 82. As the saw 76 reciprocates, the bed is moved in the direction of arrow 84, and then the platform 74 is rotated. After the cuts are formed, the array formed from the plate of transducer material is bonded to a lens.

Figure 3:
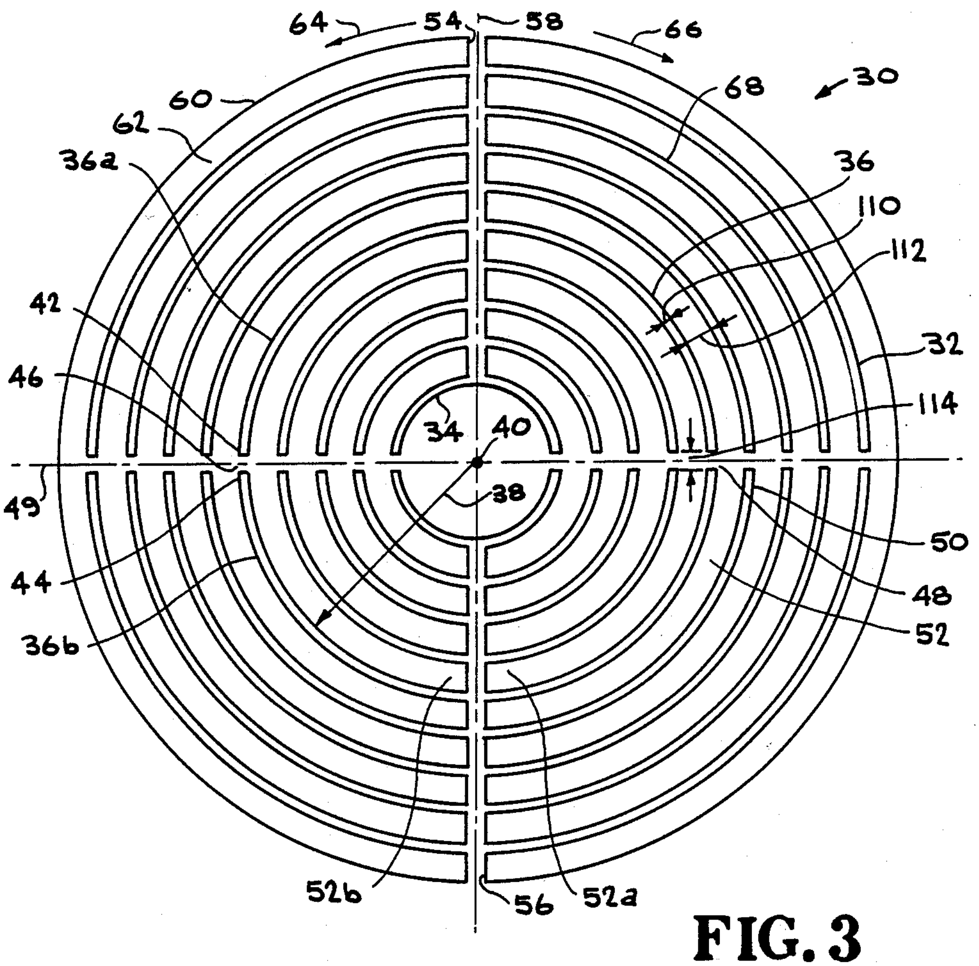
FIG. 3 is a plan view of an annular acoustic transducer array in accordance with the present invention.

If the largely radial cuts shown in FIG. 3 at 54 and 56 are not wanted, it is possible to drill holes along a cut such as 32 and to then thread the cutting wire through the hole and then proceed to form the cut. However, the largely radial cuts 54, 56 make cutting much simpler and faster, and also have the advantage of dividing each circular land such as 52 into two land portions such as 52*a* and 52*b*. As discussed earlier in connection with FIG. 2, such segmentation of a ring or land has the advantage that one land portion can be advanced in phase with respect to the other, to steer the acoustic beam or direction of sensing laterally. Where such division of the land is not desired, the two land portions 52*a* and 52*b* can be electrically connected together, as by extending an electrode which extends on the upper face of land 52*a*, so that it contacts the electrode on the upper face of the land 52*b*.

Figure 5:
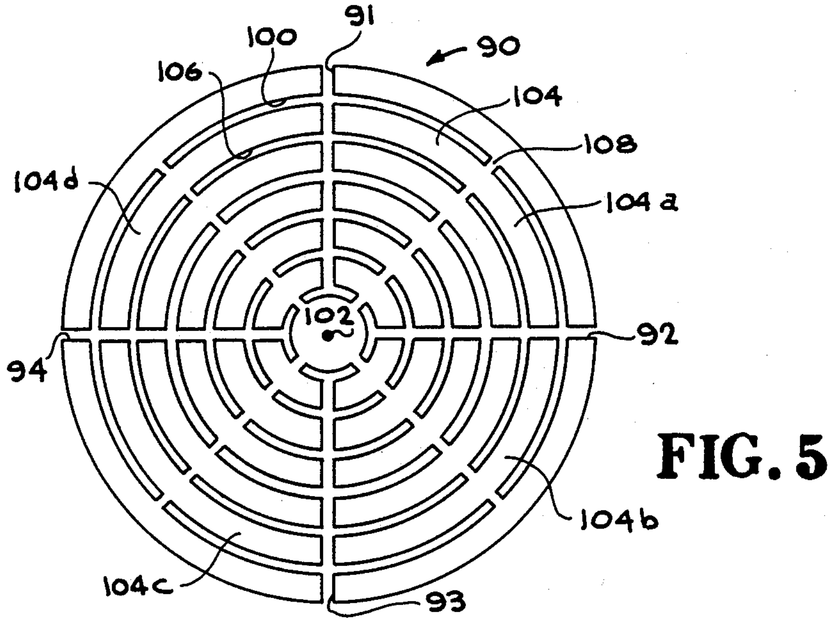
FIG. 5 is a plan view of an array of another embodiment of the invention.

FIG. 5 illustrates another array 90 which is somewhat similar to that of FIG. 3, except that the array 90 includes four largely radial cuts 91–94. Each annular cut such as cut 100 extends by slightly less than 90° about the axis 102 of the array. Each land such as 104 which is formed between a pair of cuts of different radii, such as 100, 106, is divided into four sectors 104*a*, 104*b*, 104*c*, and 104*d*. This allows steering of acoustic energy or detection, in different lateral positions.

In making a cut with the saw, such as 76 in FIG. 4, the saw is fed into the crystal transducer material at a rate less than a safe cutting rate at which the saw could be fed without danger of breakage of the substrate. Such slow cutting is made to avoid appreciable bending of the saw 76, which could cause it to wander slightly to the side, so it would not cut in a precisely straight or annular direction. It is possible to have more than the four largely radial lines 91–94 of FIG. 5, but this can result in bridges 108 that are of considerable width compared to the lengths of the cuts. In such a case, the bridges such as 108 can be removed as by the use of air abrasive jets just at the bridges.

Applicant has constructed arrays of the type shown in FIG. 3. One array, used for transmitting acoustic energy of a frequency of about 5 megahertz, is formed of a thick crystal of lithium niobate having a thickness of about one millimeter and an outer diameter of about two centimeters. Each cut such as 36 has a width 110 of about one-fourth millimeter, and the lands such as 52 between adjacent cuts have a width 112 of about one-half millimeter. The bridges such as 48 have a width 114 of about one millimeter. For thinner crystals, the width of the bridges should be thicker to avoid breakage, though all of this depends upon the degree of gentleness of the handling of the array until it can be bonded to the lens. The lands can be of different widths.

Thus, the invention provides an annular acoustic transducer array and a method for producing it, which results in low cost arrays with transducer lands or rings held precisely concentric. The array has a plurality of concentric annular cuts, each set of cuts having a different radius to form lands between adjacent sets of cuts, and each set of cuts having at least two cuts with their ends spaced to leave bridges between them. The bridges hold the array together until it can be mounted on a lens. The array can be formed by sawing, by sawing largely along a largely radial line and sawing annular cuts on either side of the line.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A method for forming an annular acoustic transducer array from a largely plate-shaped workpiece of acoustic transducer material, and mounting the array on a supporting surface comprising:

forming a plurality of sets of concentric annular cuts in and completely through said workpiece, each set of annular cuts including at least a pair of cuts formed so as to extend by less than 360° and having a pair of cut ends, said plurality of sets of cuts each being of different radii and radially spaced from one another to leave annular lands between cuts of different radii;

said step of forming including extending each of said pair of cuts of a set toward but short of each other to form said cut ends which are spaced apart to leave a bridge between them, whereby to hold the lands concentric until they can be mounted on a supporting surface.

2. The method described in claim 1 wherein:

said sets of annular cuts are each concentric to a predetermined axis;

said step of forming includes mounting said workpiece on a platform that is both rotatable about said axis and slideable with respect to a saw tool in a direction largely radial to said axis;

said step of forming includes sliding said platform with respect to said saw tool along said direction in steps, and after each step rotating said platform about said axis first in one direction and then in an opposite direction, whereby to form a radial cut through the middle of each annular cut.

3. The method described in claim 1 wherein:

said sets of annular cuts are each concentric to a predetermined axis; and said step of forming includes forming said cuts with a bridge between the ends of two cuts of each set, said bridges lying substantially on an imaginary line which is largely radial to said axis.

4. A method for forming an acoustic transducer from a plate of transducer material, comprising:

sawing through said plate substantially along each of two imaginary lines, each line being largely radial to an imaginary axis that extends substantially normal to said plate, including sawing from one edge of said plate along most but less than all of the distance toward said axis along each line;

sawing annular cuts in opposite directions from each line, each annular cut being concentric to said axis but different annular cuts being of different radial distances from said axis and being radially spaced to leave lands between them, the annular cuts of the same radius from each line extending to ends that are short of one another to leave bridges between the ends.

5. The method described in claim 4 including:

bonding said plate with said cuts therein to one face of a lens.

6. The method described in claim 4, additionally including the steps of sawing through said plate substantially along two additional imaginary lines located intermediate said two imaginary lines, each of said two additional imaginary lines being largely radial to said imaginary axis and each having a length substantially equal to that of each of said two imaginary lines;

sawing annular cuts in opposite directions from each of said two additional imaginary lines, each annular cut from said two additional imaginary lines having a radial distance of said annular cuts from said two imaginary lines, said annular cuts from said two additional imaginary lines extending to ends that are short of an end of an annular cut of said two imaginary lines to leave bridges between the ends.

7. The method described in claim 6, wherein the steps of forming the two imaginary lines and the two additional imaginary lines are carried out by locating each of said lines around said imaginary axis so as to be substantially 90° apart with respect to one another; and wherein the steps of sawing the annular cuts are carried out such that said annular cuts from said two imaginary lines and from said two additional imaginary lines each extend less than 90° about said axis.

8. The method described in claim 4, wherein said step of forming the two imaginary lines is carried out by locating said imaginary lines around said imaginary axis so as to be substantially 180° apart with respect to each other; and wherein the step of sawing the annular cuts is carried out such that the annular cuts each extend less than 180° about said axis.

9. An annular array which is useful in forming an acoustic transducer array, comprising:

a plate of acoustic transducer material having a plurality of sets of annular cuts, each sets of annular cuts having at least a pair of cuts extending completely through said plate and concentric with a predetermined axis, and each annular cut of a set having the same radius with respect to said axis and extending less than 180° about said axis;

each annular cut of a set having a pair of ends that are each spaced from an end of another annular cut of the set to leave a bridge between them, and each set of annular cuts forming at least two bridges that each lie on an imaginary line that extends largely radially with respect to said axis.

10. The annular array described in claim 9 wherein:

each set includes two annular cuts such that each annular cut extends by less than 180° about said axis;

each annular cut has a middle portion, and said plate includes two largely radial cuts each extending through a middle portion of a different annular cut of each set of annular cuts.

* * * * *